(12) United States Patent
Zhang et al.

(10) Patent No.: US 11,972,815 B2
(45) Date of Patent: Apr. 30, 2024

(54) POST-WRITE READ TECHNIQUES TO IMPROVE PROGRAMMING RELIABILITY IN A MEMORY DEVICE

(71) Applicant: SanDisk Technologies LLC, Addison, TX (US)

(72) Inventors: Ke Zhang, Shanghai (CN); Minna Li, Shanghai (CN); Li Liang, Shanghai (CN)

(73) Assignee: SanDisk Technologies, LLC, Addison, TX (US)

( * ) Notice: Subject to any disclaimer, the term of this patent is extended or adjusted under 35 U.S.C. 154(b) by 225 days.

(21) Appl. No.: 17/741,182

(22) Filed: May 10, 2022

(65) Prior Publication Data
US 2023/0368851 A1    Nov. 16, 2023

(51) Int. Cl.
| | |
|---|---|
| *G11C 11/34* | (2006.01) |
| *G11C 16/08* | (2006.01) |
| *G11C 16/10* | (2006.01) |
| *G11C 16/26* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01); *G11C 16/26* (2013.01)

(58) Field of Classification Search
CPC ... G11C 16/3459; G11C 16/08; G11C 16/102; G11C 16/26
USPC .................................................. 365/185.22
See application file for complete search history.

(56) References Cited

U.S. PATENT DOCUMENTS

| | | | | |
|---|---|---|---|---|
| 7,453,731 | B2 * | 11/2008 | Tu ....................... | G11C 11/5628 |
| | | | | 365/185.11 |
| 7,599,223 | B2 * | 10/2009 | Tu ....................... | G11C 29/021 |
| | | | | 365/185.26 |
| 8,379,454 | B2 * | 2/2013 | Kochar .................. | G11C 29/52 |
| | | | | 365/189.011 |
| 8,750,042 | B2 | 6/2014 | Sharon et al. | |
| 9,164,526 | B2 * | 10/2015 | Pan ....................... | G11C 16/06 |
| 9,165,683 | B2 | 10/2015 | Tam | |
| 9,437,321 | B2 | 9/2016 | Tseng et al. | |
| 9,548,105 | B1 | 1/2017 | Lee et al. | |
| 9,934,872 | B2 | 4/2018 | Magia et al. | |
| 10,629,272 | B1 * | 4/2020 | Lu ....................... | G11C 16/0483 |
| 10,636,498 | B1 * | 4/2020 | Lien .................... | G11C 16/0483 |
| 10,726,922 | B2 * | 7/2020 | Yang ..................... | H10B 51/50 |

(Continued)

*Primary Examiner* — Viet Q Nguyen
(74) *Attorney, Agent, or Firm* — Dickinson Wright PLLC; Steven C. Hurles

(57) ABSTRACT

The memory device includes a controller that is configured to program a plurality of memory cells of a selected word line in a plurality of programming loops and count the number of programming loops to complete programming. The controller is also configured to compare the number of programming loops to complete programming of the memory cells of the selected word line to at least one of a predetermined upper limit and a predetermined lower limit to determine if a plane containing the selected word line is at an elevated risk for read failure. In response to the controller making a determination that the plane containing the selected word line is at an elevated risk for read failure, the controller is configured to conduct a post write read operation at least one word line of the plurality of word lines.

20 Claims, 18 Drawing Sheets

(56) References Cited

U.S. PATENT DOCUMENTS

| | | | |
|---|---|---|---|
| 10,957,397 B2* | 3/2021 | Lee | G11C 16/3468 |
| 11,456,042 B1* | 9/2022 | Yang | G11C 16/0483 |
| 2013/0031431 A1 | 1/2013 | Sharon et al. | |
| 2021/0383870 A1* | 12/2021 | Tseng | G11C 16/10 |
| 2021/0391012 A1* | 12/2021 | Masuduzzaman | G11C 16/3427 |

* cited by examiner

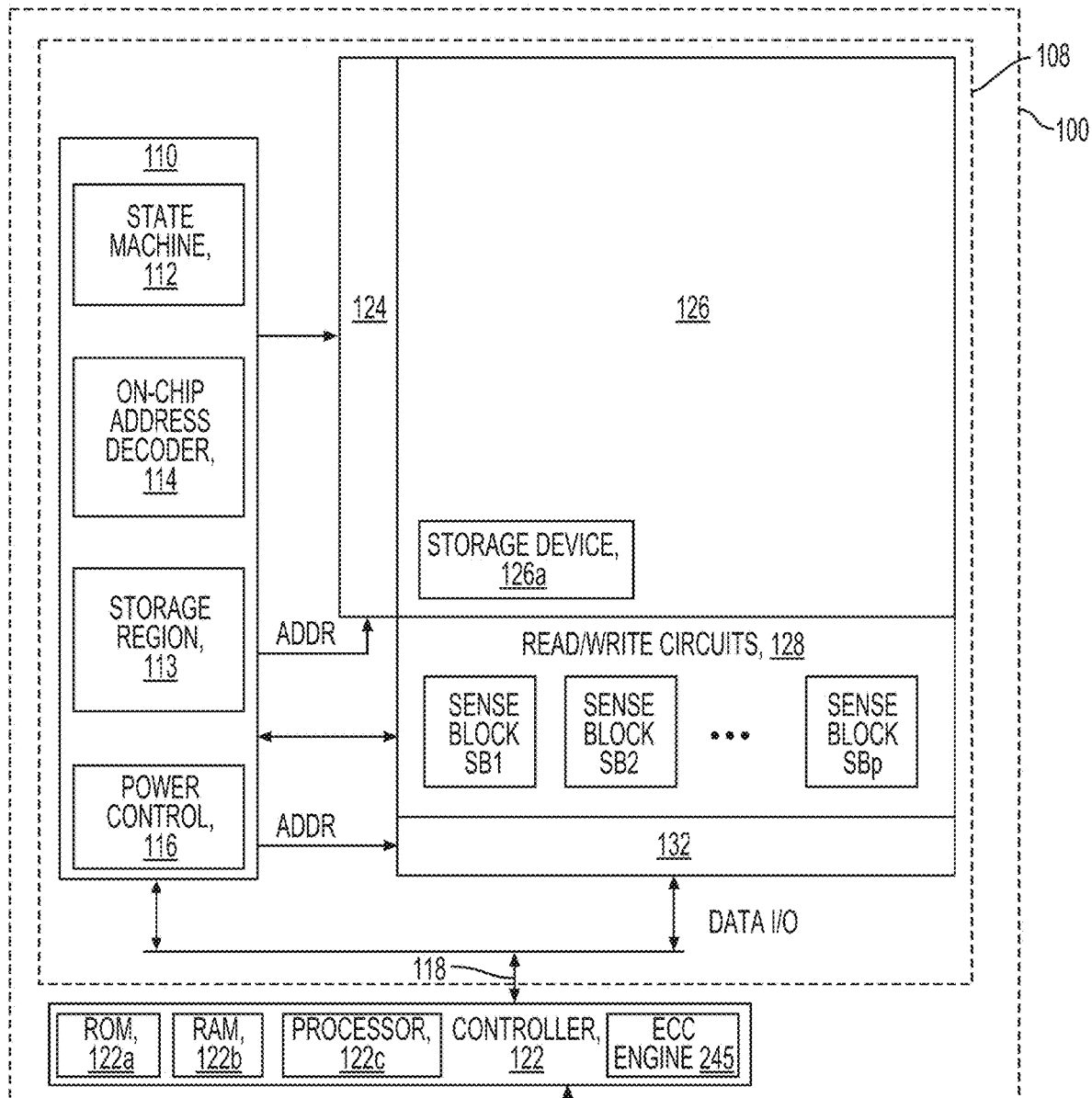
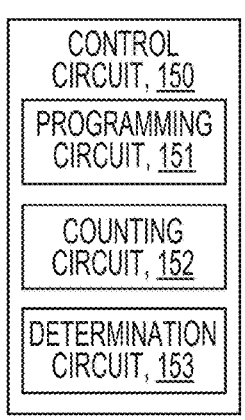
FIG. 1A
FIG. 1B

POTENTIAL READ FAILURE DISTRIBUTION

DEPWR COVERAGE

POST-WRITE READ TECHNIQUES TO IMPROVE PROGRAMMING RELIABILITY IN A MEMORY DEVICE

BACKGROUND

1. Field

The present disclosure is related generally to programming techniques in a memory device that reduce programming failure, particularly UECC failure.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

Such memory devices typically include a plurality of memory cells that are configured to be programmed to one or more threshold voltages that are associated with data states. However, sometimes programming fails to impart the correct threshold voltages into the memory cells, and these programming fails can lead to read failures. Read failures that are not detected until a read operation well after programming can sometimes lead to data loss. Therefore, it is advantageous to detect such failures immediately after programming to that the failures can be corrected or the data being programmed can be stored elsewhere in the memory device before it is lost. Various techniques exist to detect programming errors immediately after programming is completed; however, many such techniques consume significant resources and time, and therefore, such techniques frequently come with a performance penalty.

SUMMARY

An aspect of the present disclosure is related to a memory device that includes a plurality of memory cells arranged in a plurality of word lines. The memory device also includes a controller in electrical communication with the plurality of memory cells. The controller is configured to program the memory cells of a selected word line of the plurality of word lines in a plurality of programming loops and count the number of programming loops to complete programming. The controller is also configured to compare the number of programming loops to complete programming of the memory cells of the selected word line to at least one of a predetermined upper limit and a predetermined lower limit to determine if a plane containing the selected word line is at an elevated risk for read failure. In response to the controller making a determination that the plane containing the selected word line is at an elevated risk for read failure, the controller is configured to conduct a post write read operation at least one word line of the plurality of word lines.

According to another aspect of the present disclosure, the plane containing the selected word line is a first plane, and the memory device further includes at least one additional plane adjacent the first plane. The controller is configured to conduct the post write read operation on word lines of both of the first plane and the at least one additional plane in response to the number of programming loops to complete programming of the selected word line being greater than the predetermined upper limit or being less than the predetermined lower limit.

According to yet another aspect of the present disclosure, each word line of the plurality of word lines includes a plurality of strings, and the controller is configured to program the memory cells of the selected word line on a string by string basis.

According to still another aspect of the present disclosure, the controller programs the memory cells of all of the strings of the selected word line prior to conducting the post write read operation.

According to a further aspect of the present disclosure, the controller is configured to perform a data recovery operation in response to at least one word line failing the post write read operation.

According to yet a further aspect of the present disclosure, the controller is configured to disable a plane containing the at least one word line in response to the at least one word line failing the post write read operation.

According to still a further aspect of the present disclosure, the controller is configured to program three bits of data into each of the memory cells of the selected word line.

Another aspect of the present disclosure is related to a method of programming a plurality of memory cells in a memory device. The method includes the step of preparing a memory device that includes a plurality of memory cells arranged in a plurality of word lines. The method continues with the step of programming the memory cells of a selected word line of the plurality of word lines in a plurality of programming loops while counting the number of programming loops to complete programming. The method proceeds with the step of comparing a total number of programming loops to complete programming of the memory cells to at least one of a predetermined upper limit and a predetermined lower limit to determine if a plane containing the selected word line is at an elevated risk of read failure. In response to a determination that the plane is at an elevated risk of read failure, the method continues with the step of conducting a post write read operation on at least one word line of the plurality of word lines.

According to another aspect of the present disclosure, the plane containing the selected word line is a first plane, and the memory device and further includes at least one additional plane. The method further includes the step of conducting the post write read operation on word lines of both of the first plane and the at least one additional plane in response to the number of the determination that the number of programming loops to complete programming of the selected word line is greater than the predetermined upper limit or is less than the predetermined lower limit.

According to yet another aspect of the present disclosure, each word line of the plurality of word lines includes a plurality of strings and wherein the memory cells of the selected word line are programmed on a string by string basis.

According to still another aspect of the present disclosure, the memory cells of all of the strings of the selected word line are programmed prior to conducting the post write read operation.

According to a further aspect of the present disclosure, the method further includes the step of performing a data recovery operation in response to at least one word line failing the post write read operation.

According to yet a further aspect of the present disclosure, the method further includes the step of disabling the plane containing the at least one word line in response to the at least one word line failing the post write read operation.

According to still a further aspect of the present disclosure, three bits of data are programmed into each memory cell of the selected word line during the step of programming the memory cells.

Yet another aspect of the present disclosure is related to an apparatus that includes a plurality of memory cells arranged in a plurality of word lines. The apparatus also includes a programming means that is in electrical communication with the plurality of memory cells for programming the memory cells. The programming means is configured to program the memory cells of a selected word line in a plurality of program-verity iterations while counting a number of program-verify iterations to complete programming. The programming means is also configured to compare the number of programming loops to complete programming to predetermined criteria to determine if a plane containing the selected word line is at an elevated risk for read failure. In response to a determination that the plane containing the selected word line is at an elevated risk for read failure, the programming means is further configured to conduct a post write read operation on at least one word line of the plurality of word lines.

According to another aspect of the present disclosure, the plane containing the selected word line is a first plane, and the apparatus further includes at least one additional plane adjacent the first plane. The programming means is configured to conduct the post write read operation on word lines of both of the first plane and the at least one additional plane in response to the number of programming loops to complete programming of the selected word line being greater than a predetermined upper limit or being less than a predetermined lower limit.

According to yet another aspect of the present disclosure, each word line of the plurality of word lines includes a plurality of strings, and the programming means is configured to program the memory cells of the selected word line on a string by string basis.

According to still another aspect of the present disclosure, the programming means programs the memory cells of all of the strings of the selected word line prior to conducting the post write read operation.

According to a further aspect of the present disclosure, the programming means is configured to perform a data recovery operation in response to at least one word line failing the post write read operation.

According to yet a further aspect of the present disclosure, the programming means is configured to disable a plane containing the at least one word line in response to the at least one word line failing the post write read operation.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 1A is a block diagram of an example memory device;

FIG. 1B is a block diagram of an example control circuit;

DESCRIPTION OF THE ENABLING EMBODIMENT

Figure 2:
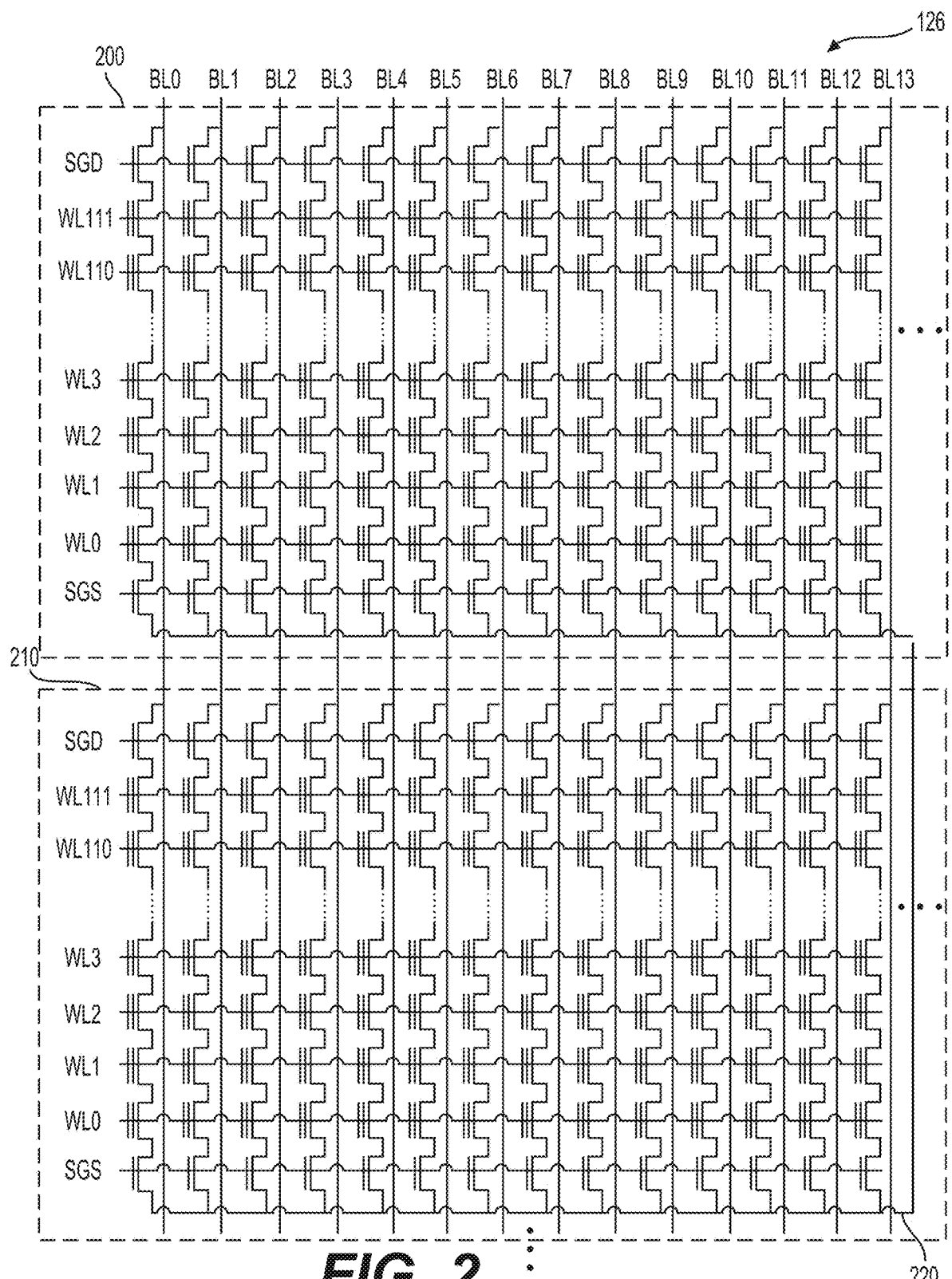
FIG. 2 depicts blocks of memory cells in an example two-dimensional configuration of the memory array of FIG. 1A.

Referring to the Figures, wherein like numerals indicate corresponding parts throughout the several views, one aspect of the present invention is related to an enhanced post-write read (EPWR) operation that is configured to detect potential UECC failures immediately following so that errors can be corrected without data loss and to do so with minimal performance penalty.

FIG. 1A is a block diagram of an example memory device that is capable of conducting the aforementioned programming techniques. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ... SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, ... , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
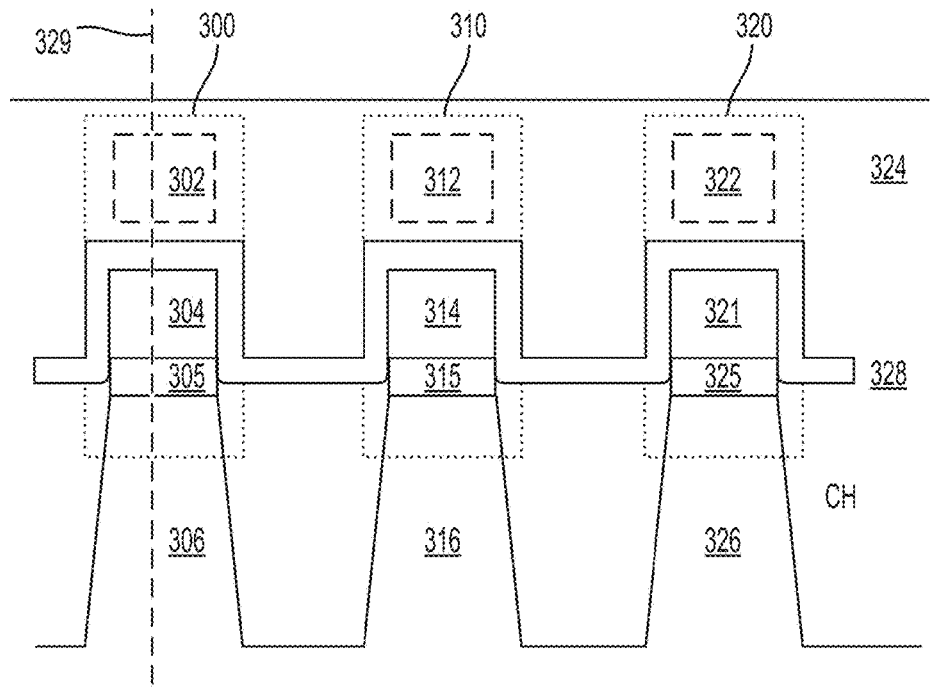
FIG. 3A and FIG. 3B depict cross-sectional views of example floating gate memory cells in NAND strings.
Figure 3B:
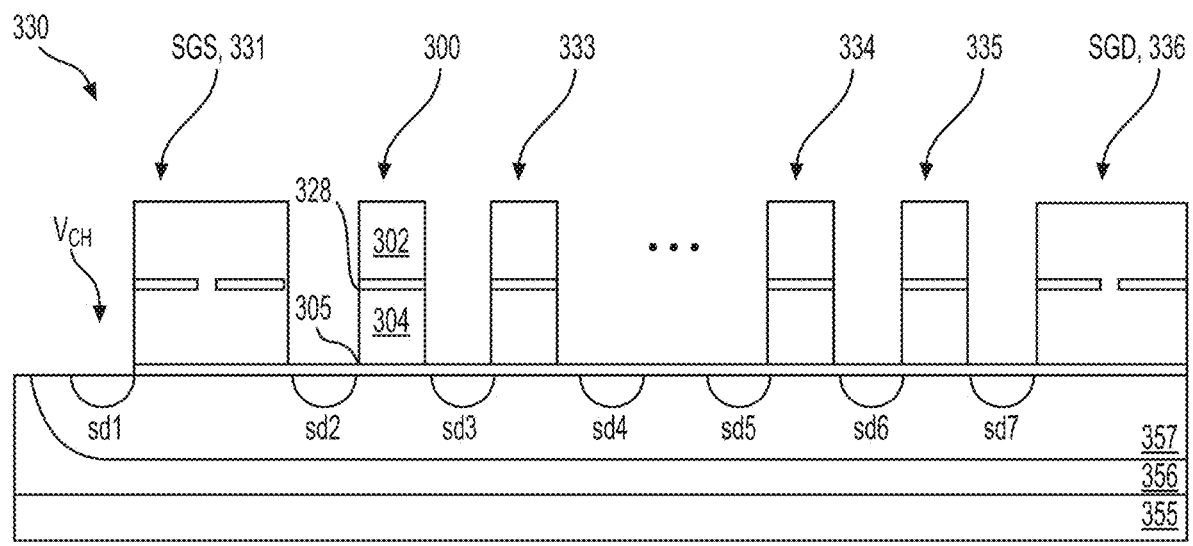

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
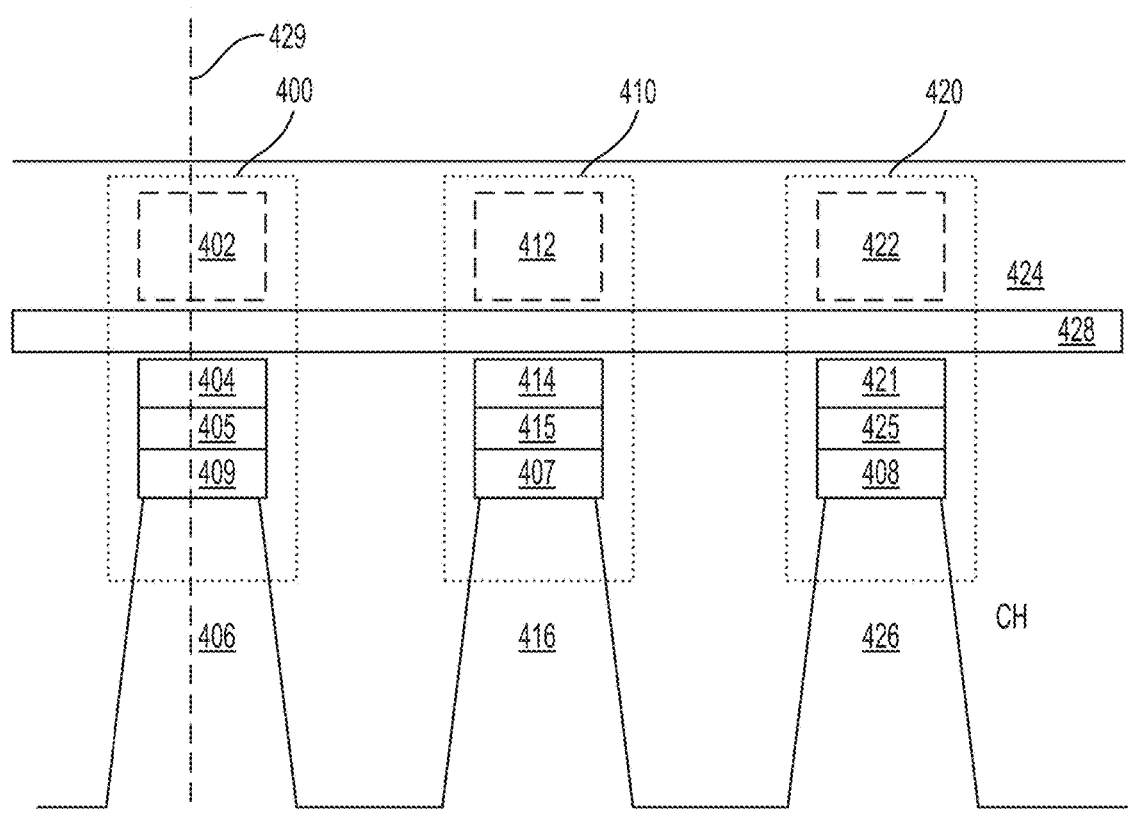
FIG. 4A and FIG. 4B depict cross-sectional views of example charge-trapping memory cells in NAND strings.
Figure 4B:
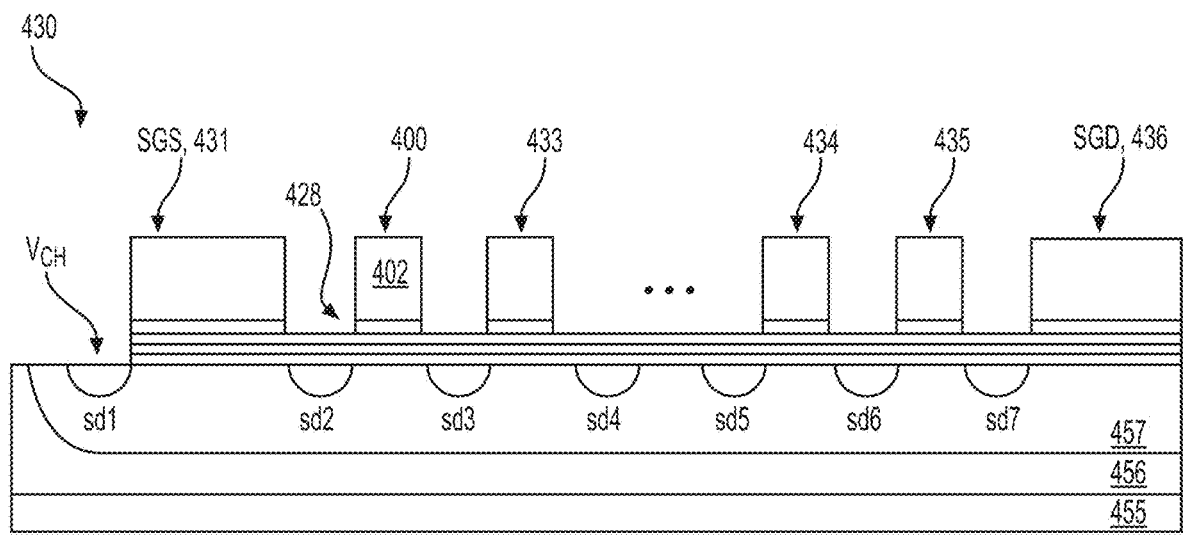

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
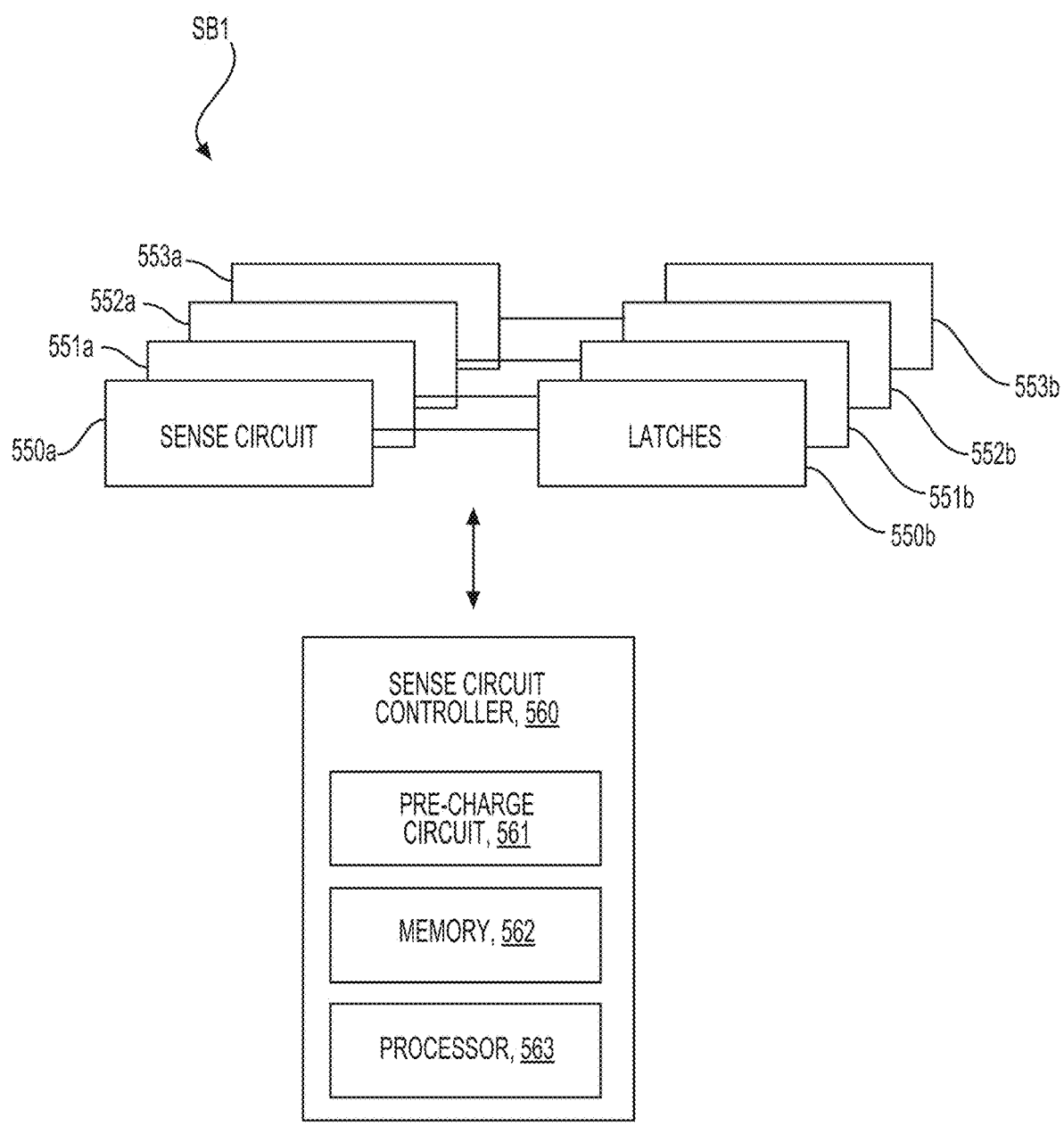
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550*b*, 551*b*, 552*b*, 553*b* which are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
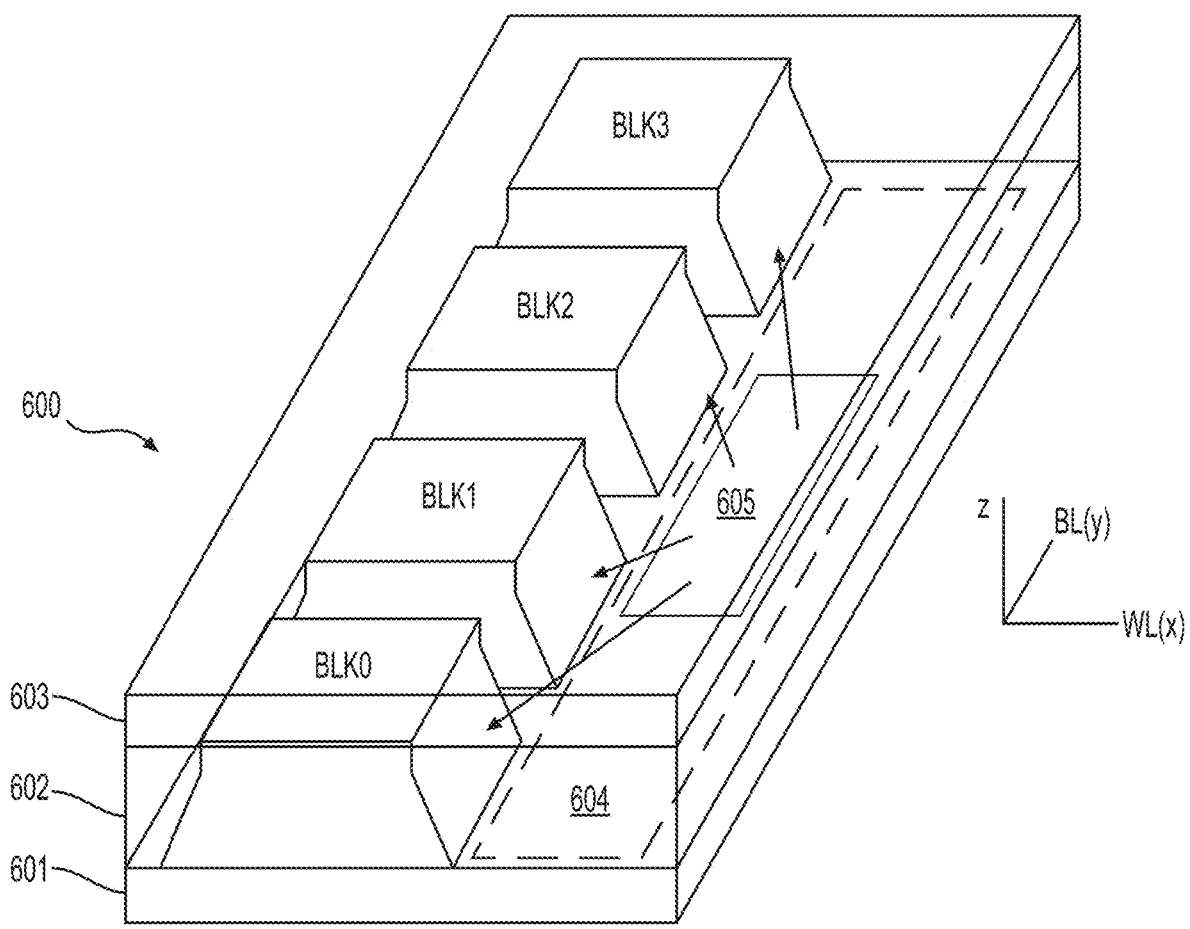
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
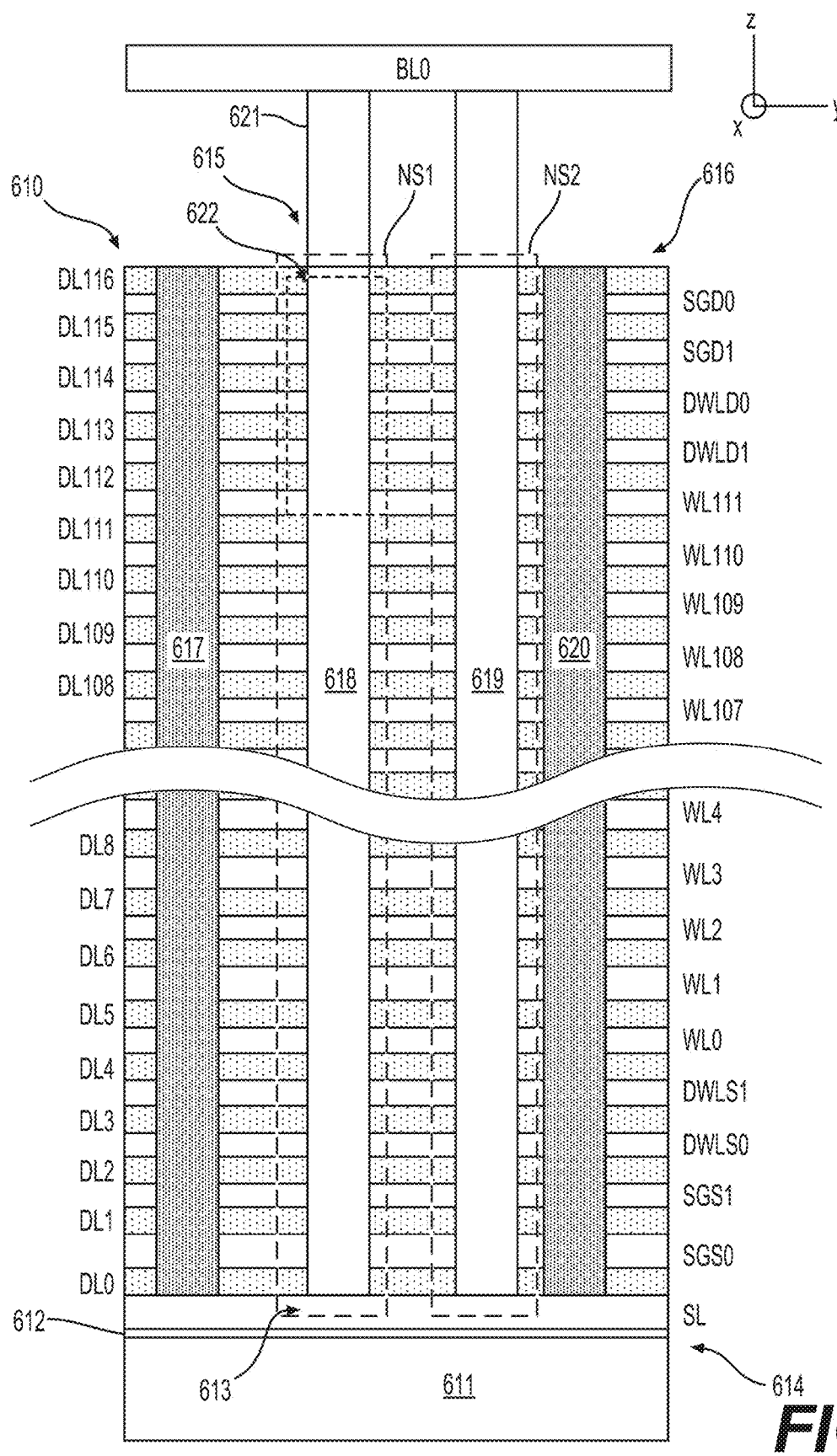
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
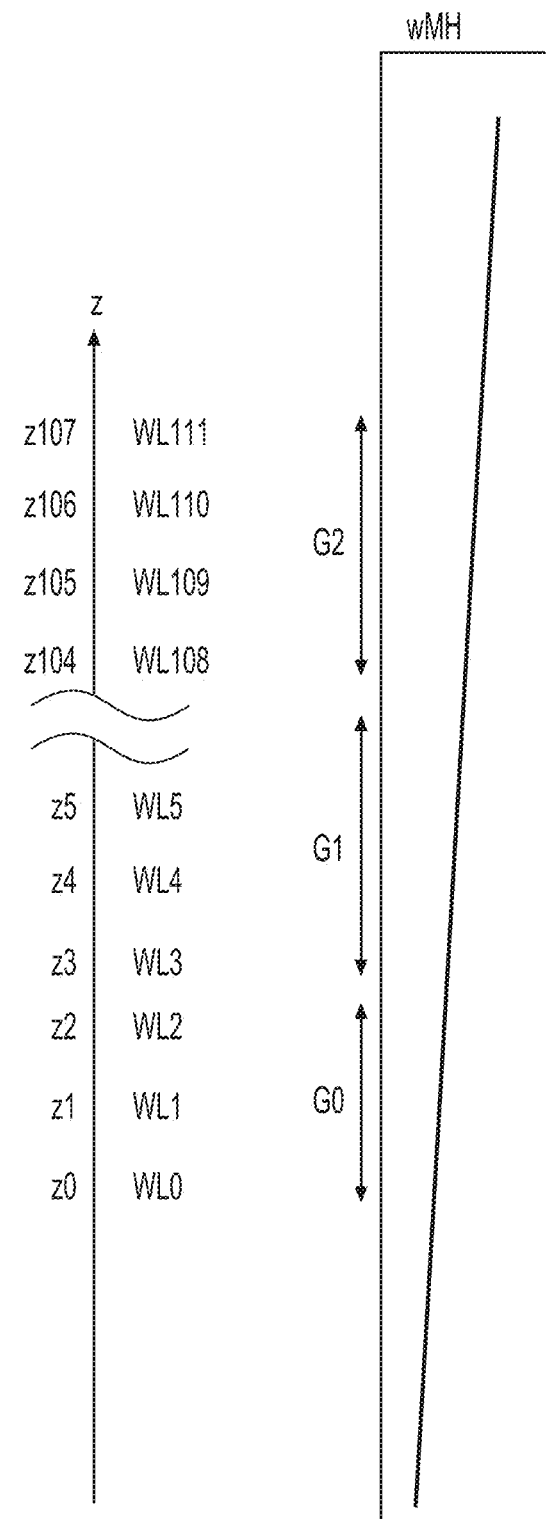
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
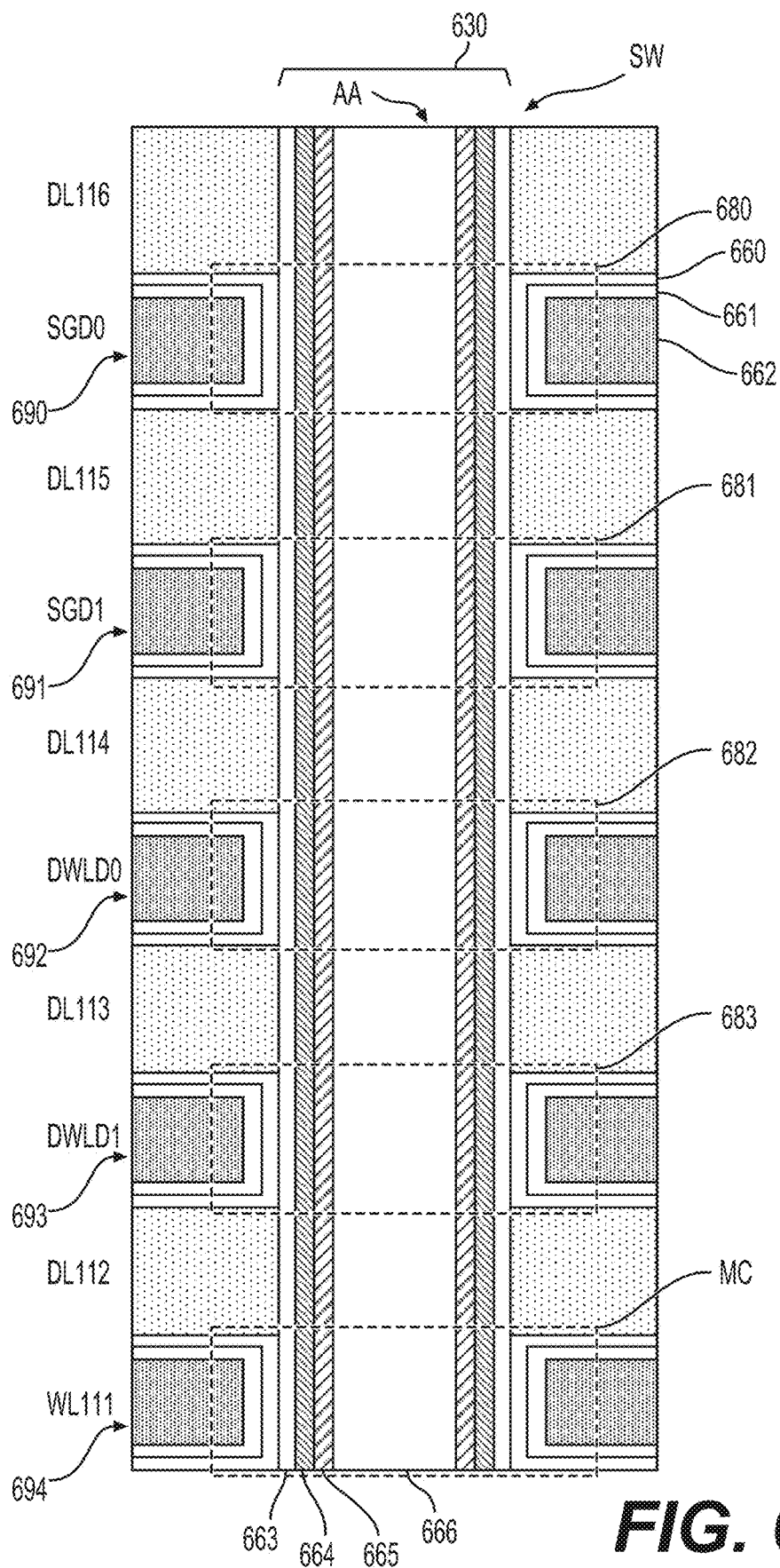
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
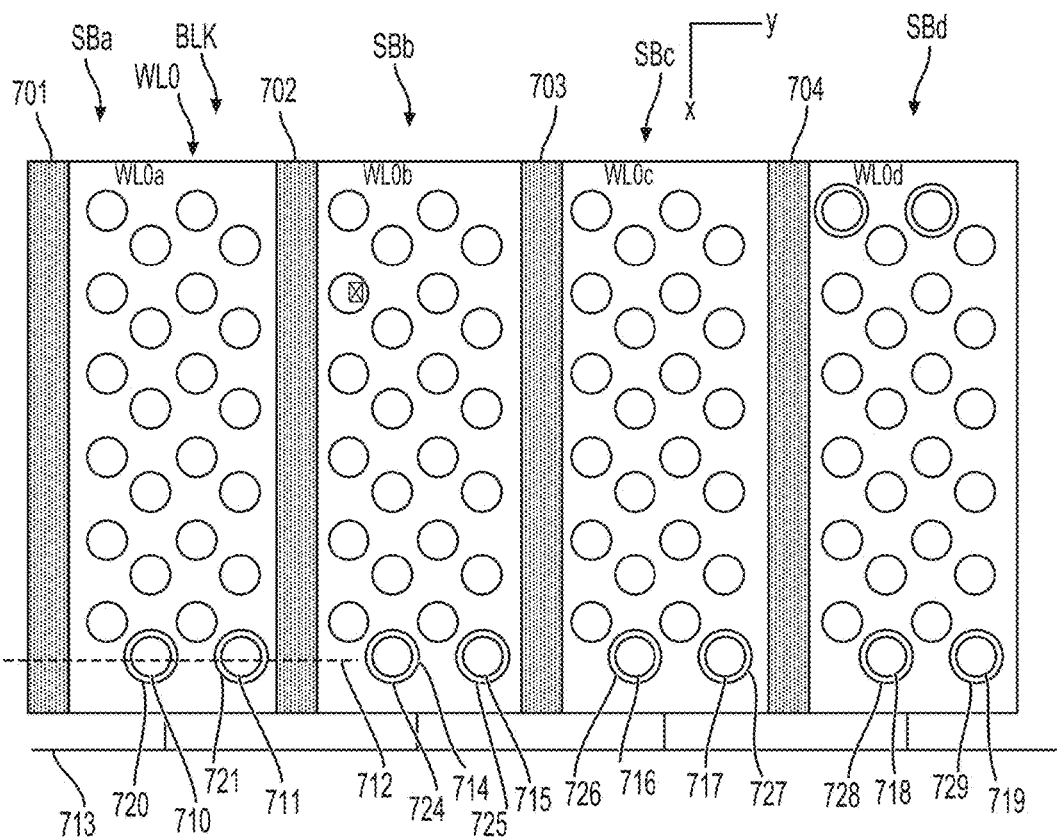
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
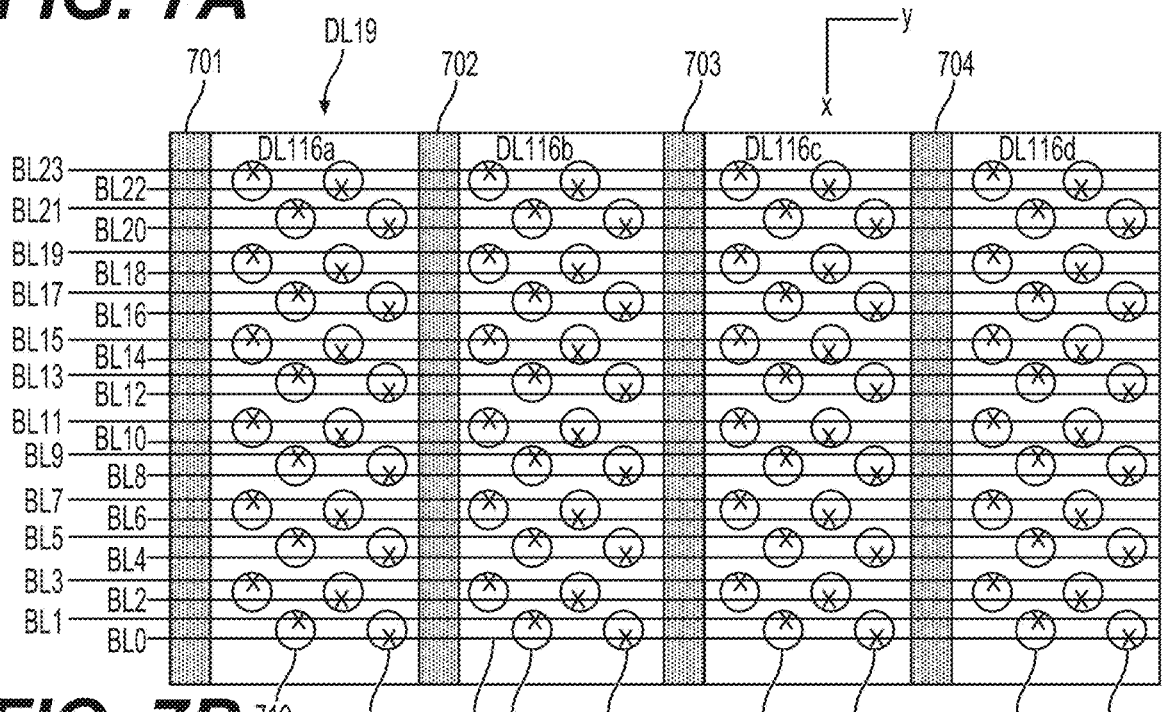
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
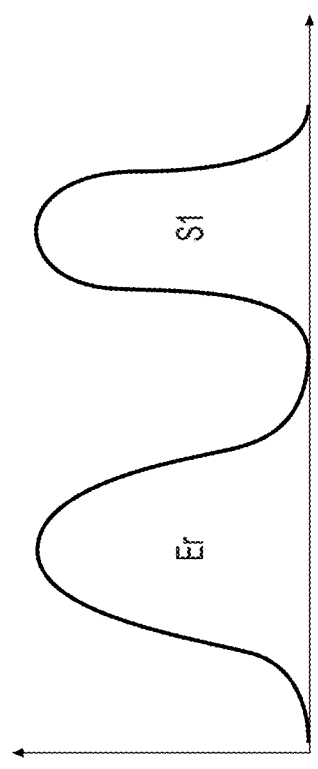
FIG. 8 depicts a threshold voltage distribution for a plurality of memory cells programmed to SLC (one bit per memory cell)
Figure 9:
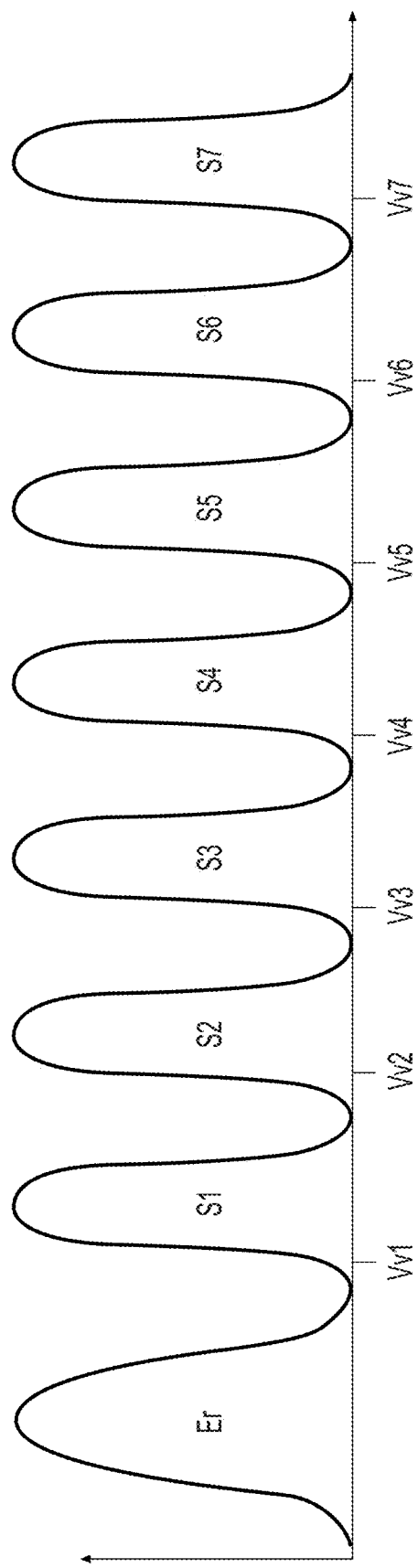
FIG. 9 depicts a threshold voltage distribution for a plurality of memory cells programmed to TLC (three bits per memory cell)

The memory cells can be programmed to store one or multiple bits in 2n data states where n is a positive integer. Each data state is associated with a respective threshold voltage Vt. For example, FIG. 8 depicts a threshold voltage Vt distribution of a one bit per memory cell (SLC) storage scheme. In an SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7 in the case of TLC) is associated with a verify voltage (Vv1-Vv7) which is employed during a verify portion of a programming operation, as discussed in further detail below. Other storage schemes are also available, such as two bits per cell (MLC) or four bits per cell (QLC).

Figure 10:
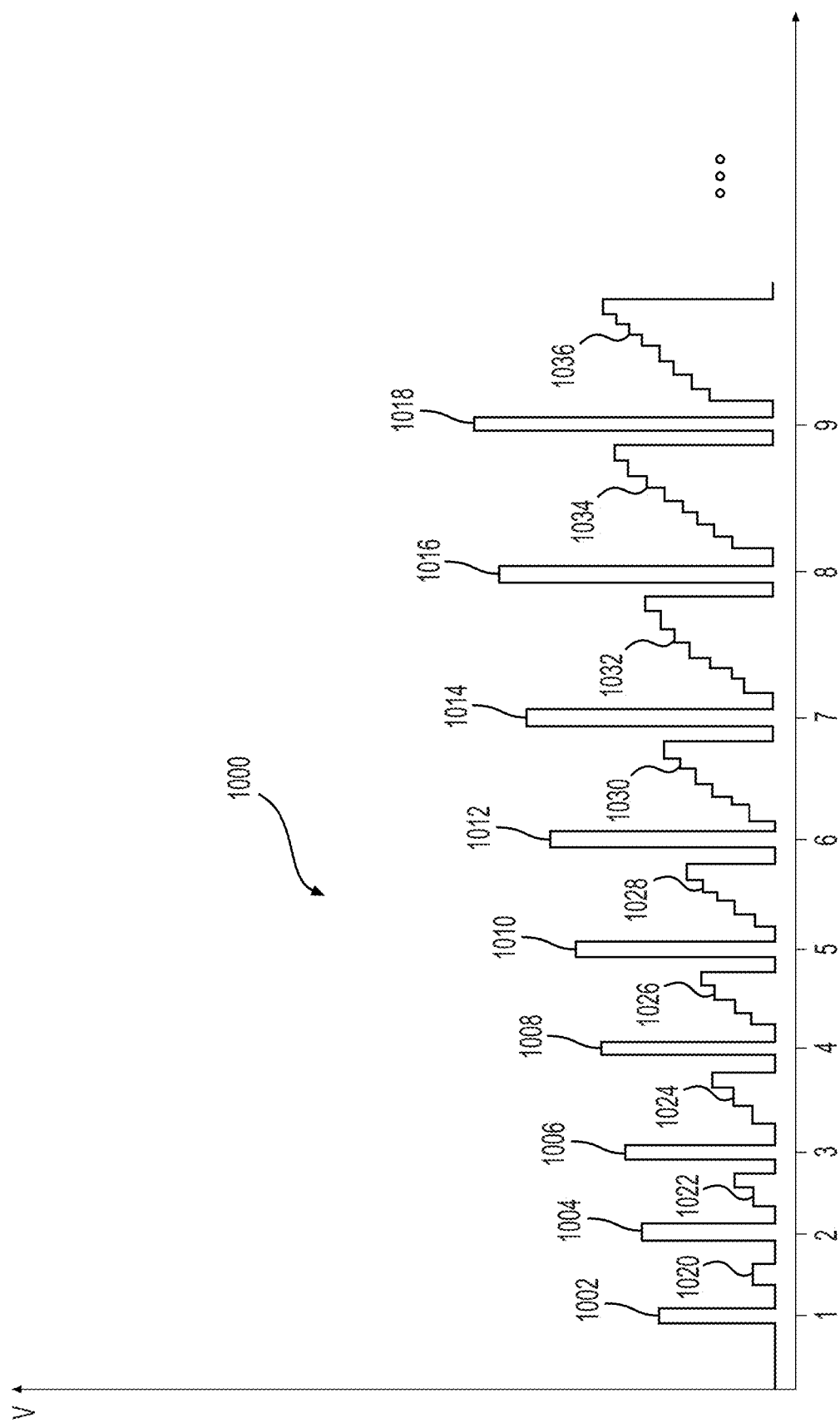
FIG. 10 depicts a voltage waveform applied to a selected word line during an operation of programming the memory cells of the selected word line.

FIG. 10 depicts a waveform 1000, or pulse train, of a programming pass of an example programming operation. The horizontal axis depicts time, and the vertical axis depicts control gate or word line voltage through multiple program-verify iterations, i.e., program loops. A square waveform is depicted for each programming pulse and each verify pulse for simplicity; however, other shapes are possible, such as a multilevel shape or a ramped shape. Further, Incremental Step Pulse Programming (ISPP) is used in this example, in which the programming (Vpgm) pulse 1002-1018 amplitude steps up in each successive program loop by a fixed increment amount, e.g., dVpgm.

The pulse train starts with a first program loop that has a programming pulse at an initial Vpgm pulse level and ends when either programming of all memory cells is completed or when the Vpgm pulse level is set to exceed a final Vpgm pulse level. The pulse train 1000 includes a series of Vpgm pulses 1002, 1004, 1006, 1008, 1010, 1012, 1014, 1016, 1018 . . . that are applied to the control gate of the selected word line. One, two, three, or more verify voltage pulses 1020-1036 are provided in each program loop after each Vpgm pulse 1002-1018, based on the target data states which are being verified in each program-verify iteration. A voltage of 0 V may be applied to the control gate of the selected word line between the Vpgm pulses and verify voltage pulses.

Programming of the memory cells of a selected word line can be conducted in either a full sequence programming operation or a multi-pass programming operation. In a full sequence programming operation, the memory cells are programmed directly to their final threshold voltages in a single programming pass, e.g., the programming pass depicted in FIG. 10. In a multi-pass programming operation, the memory cells are programmed to their final programmed data states in two or more programming passes or stages, e.g., a first pass and a second pass. The pulse train of each of these programming passes may resemble the programming pass depicted in FIG. 10.

Figure 11:
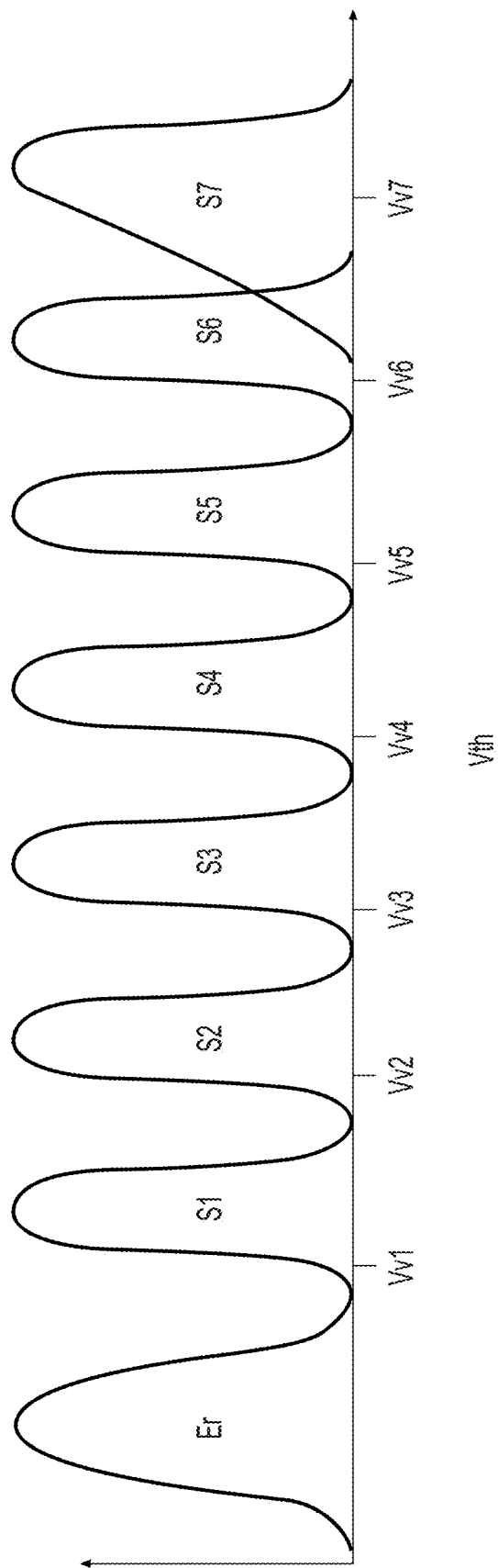
FIG. 11 depicts a threshold voltage distribution for a plurality of memory cells programmed to TLC and wherein some of the memory cells programmed to the S7 data state are underprogrammed.

It has been found that word line leakages (for example, word line to memory hole shorts, word-line to word line shorts, or word line to local interconnects shorts) are one root cause of read failure, also known as uncorrectable error correcting code (UECC) errors. As illustrated in FIG. 11, such leakages can cause the lower tail of a highest programmed data state (e.g., S7 in the case of TLC) to become deformed, which can result in read errors and, potentially, a loss of data in a bad block. Other frequent causes of UECC errors are program disturb and (PD) and neighbor plane disturb (NPD).

One approach to minimize UECC errors is to correct such programming failures during a read operation. Such approaches may involve a dynamic read, a soft bit read, threshold voltage tracking reading, and bit error rate estimation scanning. These techniques generally involve shifting a read level to decrease failed bit count (FBC) and can cover some data retention issues in a bad block but may not be able to correct severe errors.

Figure 12:
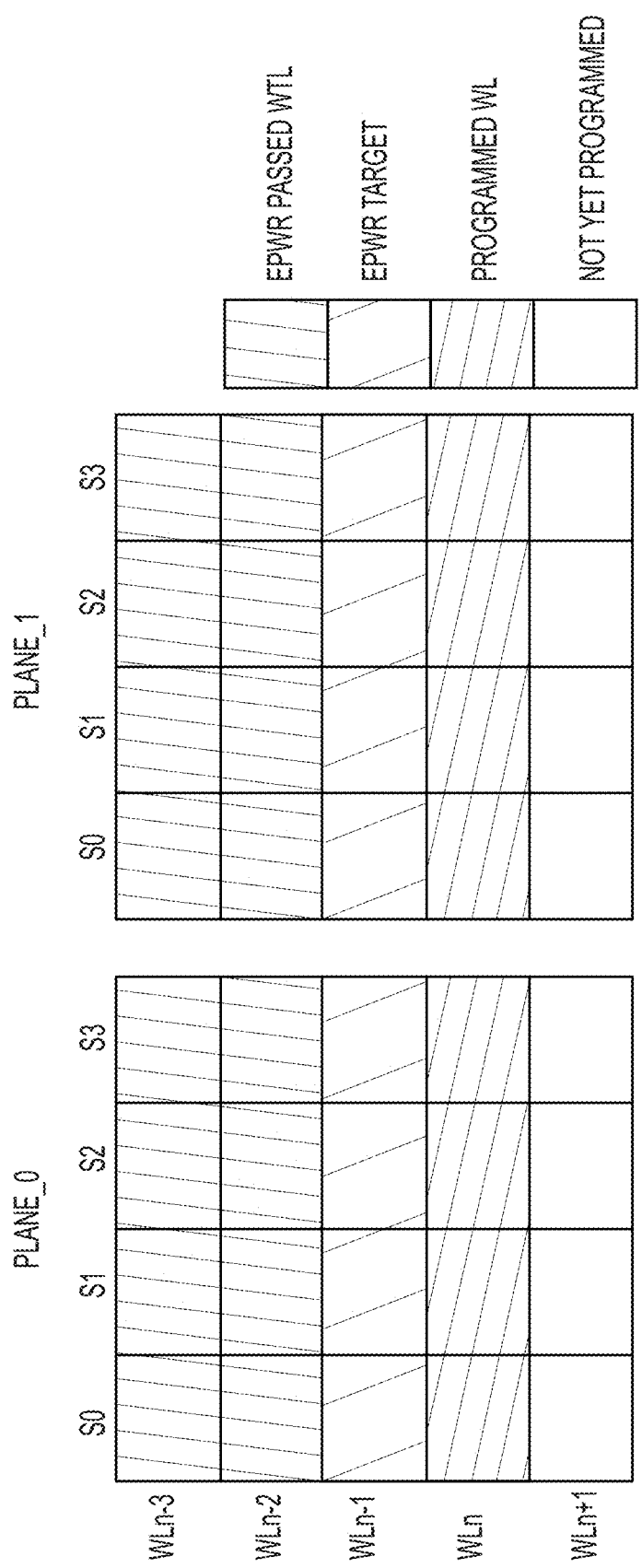
FIG. 12 is a schematic view illustrating a programming status of the memory cells in a memory block at one point during programming.

Another approach to reducing UECC errors is to contain such errors at the time of programming using a post-write read (PWR) operation wherein programmed data is read and checked for error correction code (ECC) errors before programming of a block is completed. In an example depicted in FIG. 12, following programming of a word line WLn, the PWR operation is conducted on a neighboring and previously programmed word line WLn-1. This continues until all word lines are programmed and have received the PWR operation. However, such PWR operations may be time consuming and reduce the performance of the memory device. One technique to improve performance is only to execute the PWR operation on some, rather than all, word lines.

According to the present disclosure, a programming technique is provided and that is configured to identify errors after programming so that data loss does not occur but does so in a way that minimizes the performance penalty of PWR. According to these techniques, a novel dynamic enhanced post-write read (DEPWR) operation is employed to conduct post-write read on only a very few blocks that are identified as having a potential UECC error risk, and thus, programming performance is greatly improved as compared to other known PWR techniques. As discussed in further detail below, the judgment on whether a block has a potential UECC error risk is based on program loop criteria. That is, a block is identified as having a relatively high UECC error risk if programming is completed either below a predetermined minimum number of program loops or above a predetermined maximum number of program loops. The predetermined minimum and maximum numbers of program loops may be determined experimentally by analyzing how many program loops it should take to complete programming in a good block and establishing a range of program loops that it takes to complete programming in substantially all good blocks such that completion outside of those bounds is evidence that the block may be a bad block.

Figure 13:
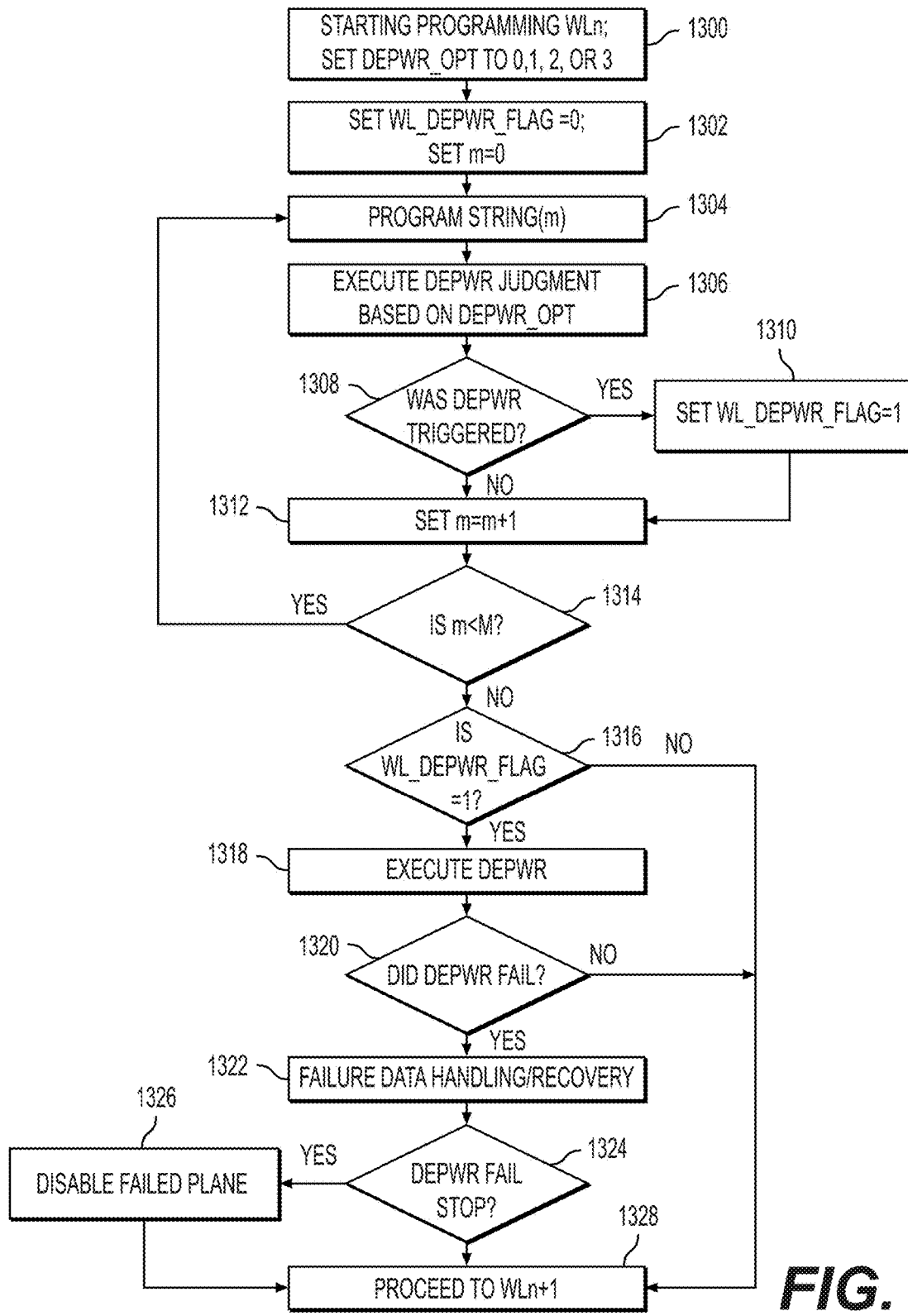
FIG. 13 depicts a flow chart illustrating the steps of a programming operation according to one aspect of the present disclosure.

Turning now to FIG. 13, a flow chart depicting the steps of an exemplary embodiment of programming the memory cells of a plurality of word lines and selectively conducting a DEPWR operation is generally shown. In this exemplary embodiment the memory cells are programmed to three bits of data per memory cell (TLC). However, it should be appreciated that these techniques can be adopted for other numbers of bits of data per memory cell, e.g., two bits per memory cell (MLC) or four bits per memory cell (QLC).

At step 1300, a programming instruction is received to start programming the memory cells of an initial word line WLn with a rolling DEPWR operation. A parameter DEPWR_OPT is set. The parameter DEPWR_OPT defines which criteria is to be employed when determining whether to trigger the DEPWR operation. In the exemplary embodiment, the parameter DEPWR_OPT can be set to "0", "1", "2", or "3". However, in other embodiments, additional or fewer options could be provided. The different DEPWR_OPT options of the exemplary embodiment are discussed in further detail in connection with step 1306.

The DWPWR criteria judgment, which is discussed in further detail below, is performed on a string-by-string basis. At step 1302, prior to programming, an initial WL_DEPWR_flag is set to zero (WL_DEPWR_flag=0), and an initial String(m) to be programmed is set to "zero" (m=0). The variable "M" defines the total number of strings per word line. The DEPWR criteria judgment is determined on a string-by-string basis. In the following steps, if all strings pass the criteria judgment, then WL_DEPWR_flag will remain at "0" and DEPWR will not be performed. Otherwise, WL_DEPWR_flag will become "1," which will signal that the block might be a bad block that has a potential for UECC failure and trigger a post-write read operation to determine if there was a programming failure.

At step 1304, a programming operation is performed on String(m) to program the memory cells in String(m). In the exemplary embodiment, the programming operation is a TLC programming operation such that three bits of data are programmed into each memory cell. However, in other embodiments, the programming operation could be SLC, MLC, QLC or any number of bits of data per memory cell. The programming operation preferably includes a plurality of program loops, each of which includes the application of a programming pulse to a selected word line and a verify operation following the programming pulse. During programming, the number of program loops to program the memory cells is continuously monitored and the number of program loops to complete programming is set to Ploop. Also during programming, a state-specific loop count (early program termination [EPT]) to complete programming for each individual data state is also monitored, and the number of program-verify loops to complete programming is set to EPT_Loop. A separate EPT_Loop counter is maintained for each programmed data state.

At step 1306, a post-TLC programming DEPWR criteria judgment is executed to determine if there is a potential that the block is bad. In the exemplary embodiment, the DEPWR judgment depends on the parameter DEPWR_OPT. Specifically, in the exemplary embodiment, if DEPWR_OPT is "0," then DEPWR is disabled and is to be skipped in all circumstances. If DEPWR_OPT is "1," then DEPWR is triggered if Ploop is either above a predetermined upper limit NLP_DU or below a predetermined lower limit NLP_DL. If DEPWR_OPT is "2," then DEPWR is triggered if EPT_Loop is either above a state-dependent predetermined EPT upper loop limit NLP_EPT_DU for triggering DEPWR or if EPT_Loop is greater than an S1 data state EPT upper loop limit NLP_EPT_S1_DU. If DEPWR_OPT is "3," then the criteria for triggering DEPWR is a combination of "1" and "2" discussed above. Specifically, if DEPWR_OPT is "3," then DEPWR is triggered if Ploop is greater than NLP_DU, if Ploop is less than NLP_DL, if EPT_Loop is greater than NLP_EPT_DU, or if EPT_Loop is greater than an S1 data state EPT upper loop limit NLP_EPT_S1_DU. Thus, different behaviors can be triggered based on what the parameter DEPWR_OPT is set at.

At decision step 1308, it is determined if DEPWR has been triggered. If the answer at decision step 1308 is "yes," then at step 1310, WL_DEPWR_flag is set to "1."

If the answer at decision step 1308 is "no" or following step 1310, at step 1312, the string being programmed is incrementally advanced, i.e., m=m+1.

At decision step 1314, it is determined if programming of the final string has not been completed, i.e., is m<M? If the answer at decision step 1314 is "yes," then the process returns to step 1304 without disabling the plane being programmed. If the answer at decision step 1314, then the process proceeds to decision step 1316.

At decision step 1316, it is determined if DEPWR has been triggered, i.e., does WL_DEPWR_flag=1? If the answer at decision step 1316 is "yes," then DEPWR is to be skipped and the process proceeds to step 1328 discussed below.

If the answer at decision step 1316 is "no," then at step 1318, the DEPWR operation is executed on at least two word lines, i.e., WLn to WLn-x. In some embodiments, the DEPWR may be executed on only a few word lines (two, three, etc.). In other embodiments, the DEPWR operation may be executed on all word lines in a block.

Figure 14A:
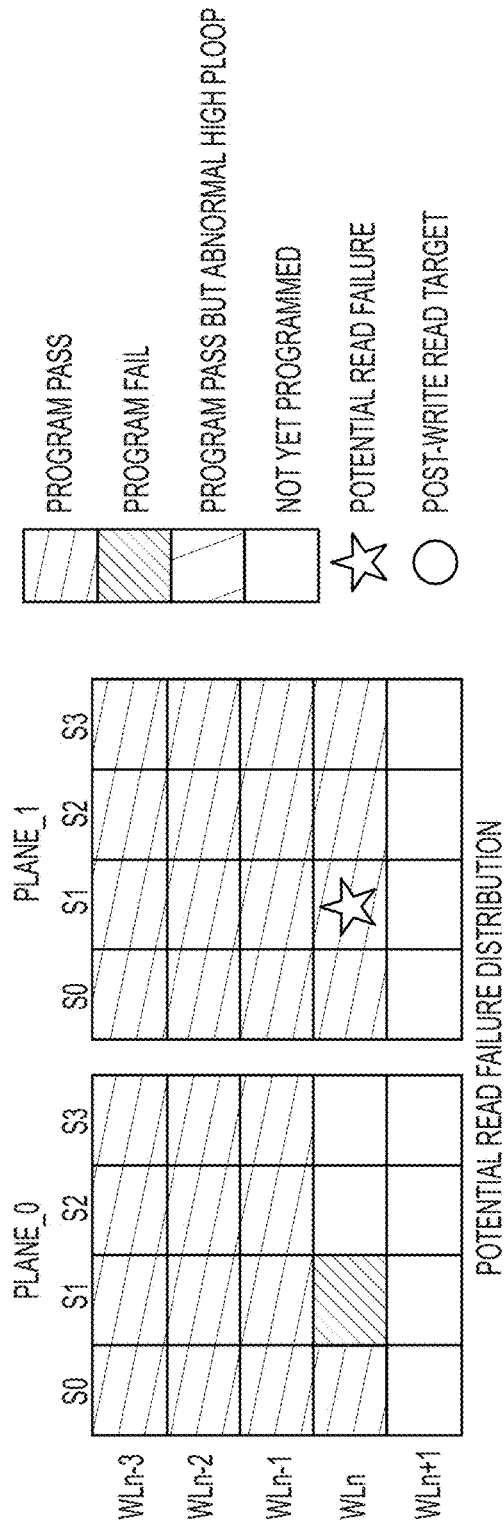
FIG. 14A depicts the programming status of the memory cells in a memory block at one point in programming and wherein programming failed for one string in one of the planes.
Figure 14B:
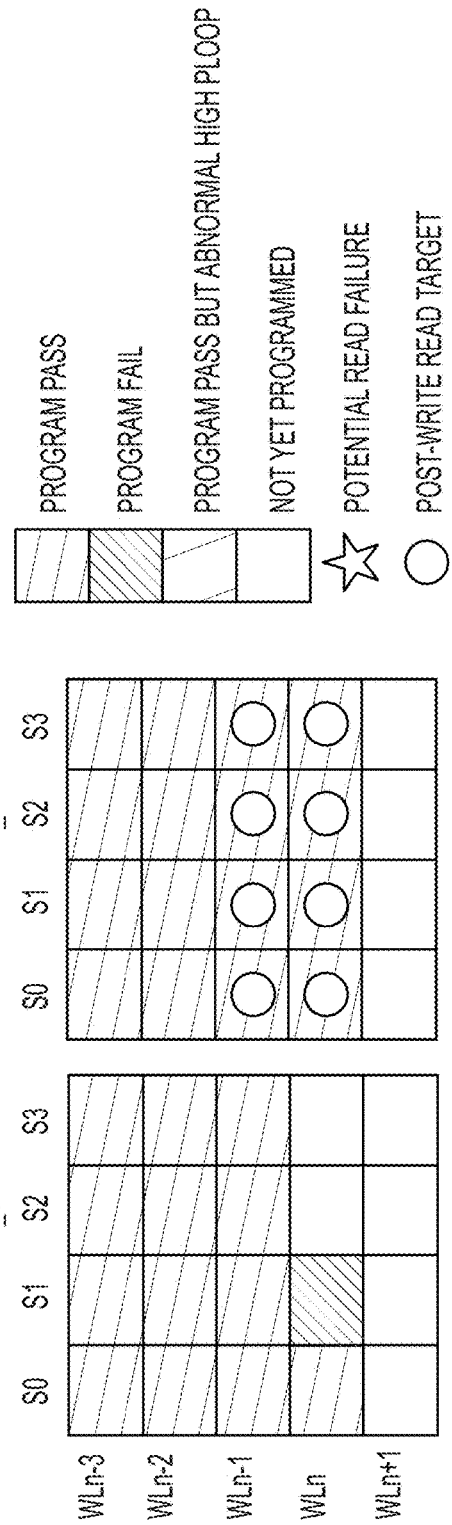
FIG. 14B identifies which strings are targeted for a post-write read operation in response to the programming failure identified in FIG. 14A.
Figure 14C:
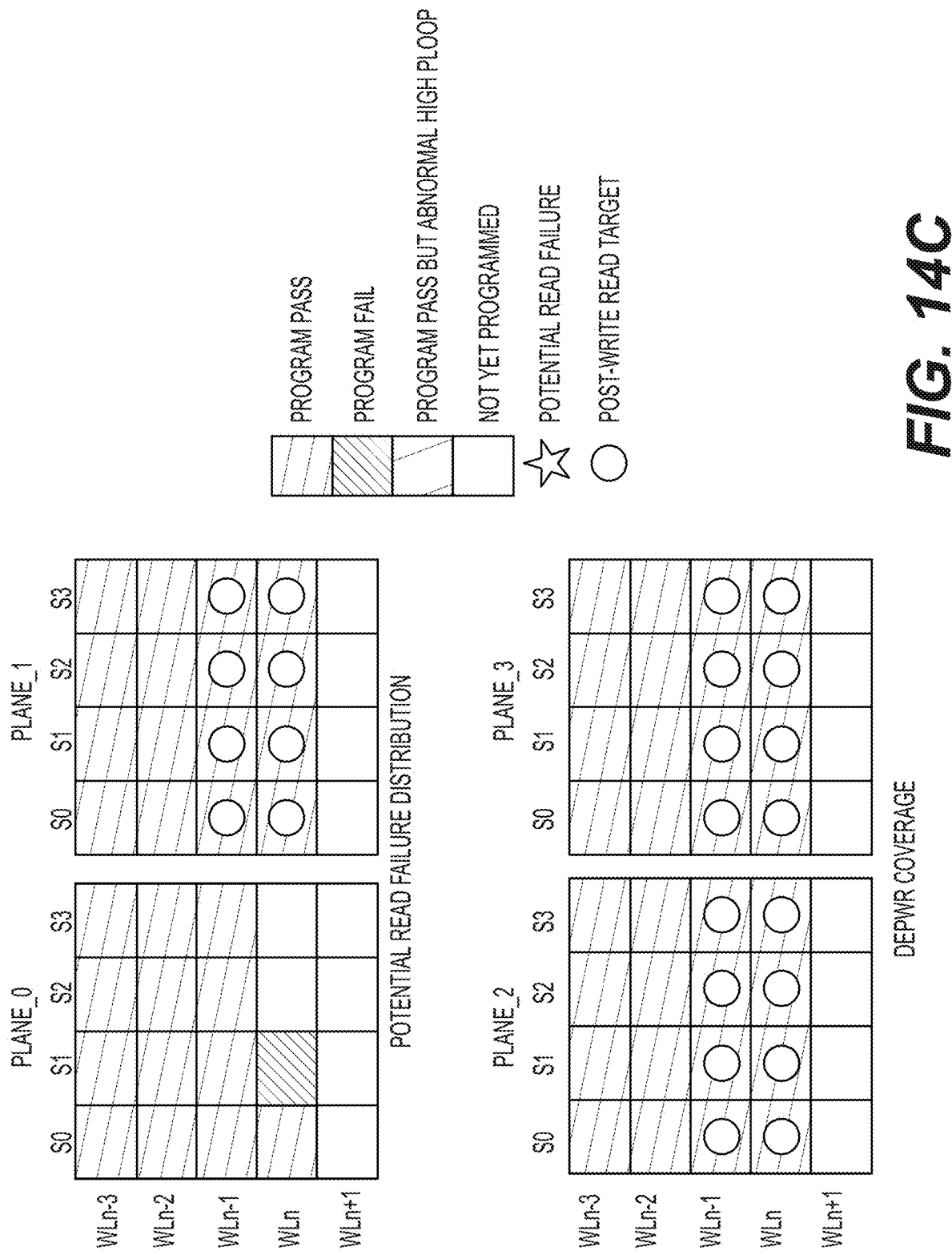
FIG. 14C is similar to FIG. 14B but in a memory die that includes four planes rather than two planes.
Figure 15A:
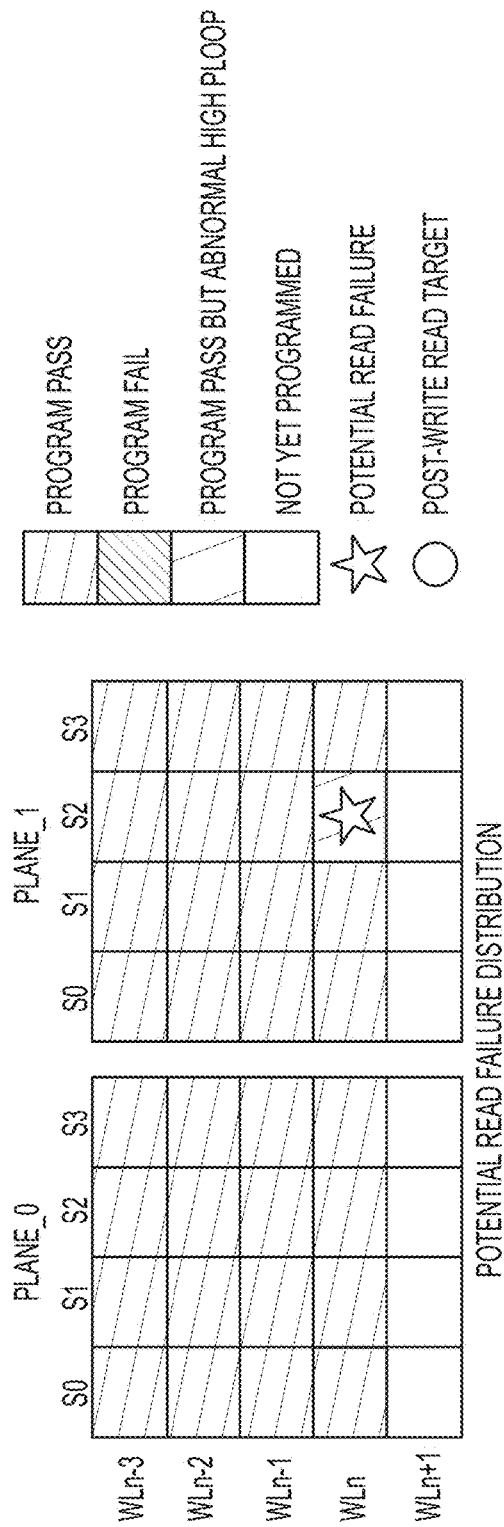
FIG. 15A depicts the programming status of the memory cells in a memory block at one point in programming and wherein programming passed but with an abnormally high loop count for one string in one of the planes.
Figure 15B:
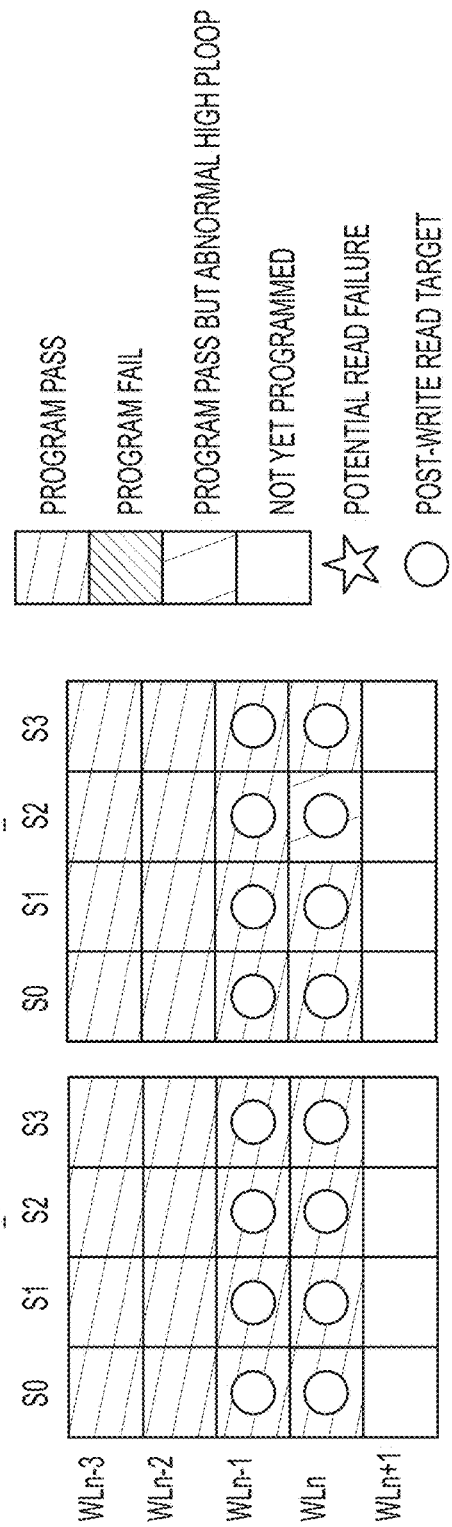
FIG. 15B identifies which strings are targeted for a post-write read operation in response to the programming failure identified in FIG. 15A.

FIGS. 14A/14B/14C and 15A/B schematically show two different exemplary planes that have different kinds of problems that could trigger a read failure to illustrate how the DEPWR techniques described herein are effective at detecting an error and minimizing the risk of UECC failure. In the first case of FIG. 14A, there is a program failure at Plane_0, WLn, String_1. As illustrated in FIG. 14B, due to NPD, there is thus an elevated read failure risk for Plane_1, WLn, String_1 while the failed word line is treated by a default program failure handling method. FIG. 14C is the same as FIG. 14B but in a device with four planes (Plane_0, Plane_1, Plane_2, and Plane_3). In the second case of FIGS. 15A and 15B, there is an abnormally high Ploop during the programming of Plane_1, WLn, String_0, i.e., programming performance of this page was completed but required a very large number of program loops to reach completion, i.e., programming was abnormally slow. The threshold voltage distribution of the memory cells of this page may exhibit a malformed S6/S7 lower tail, such as the one shown in FIG. 11, which could also lead to read failure.

In the first case of FIGS. 14A, 14B, and 14C, DEPWR will be triggered on the word line WLn and WLn-1 for Plane_1 (also, optionally, Plane_2 and Plan_3) by the Plane_0 program failure causing Ploop to exceed NLP_DU if the parameter DEPWR_OPT is set to either "1" or "3." If it is determined that the block is a bad block the data of Plane_1, word lines WLn and WLn-1 can then be isolated and the data can be written elsewhere to prevent read failure. In the second case of FIGS. 15A and 15B, while programming of Plane_1, WLn was completed, the elevated Ploop required to complete programming triggers DEPWR for all strings of WLn and WLn-1 in both Plane_0 and Plane_1. Thus, the DEPWR techniques described herein are effective at detecting both of these example errors. In the example of FIG. 14B, the triggered DEPWR on WLn-1 can be performed with a default read level while the triggered read level of triggered DEPWR on word line WLn is performed with an optimized read level (for instance, a downshifted read level). Since WLn is a boundary word line that is not subject to word line interference, which is also known as NWI attack.

Turning back the flow chart of FIG. 13, at decision step 1320, it is determined if DEWPR failed. If the answer at decision step 1320 is "no," then the process proceeds to step 1328 discussed below.

If the answer at decision step 1320 is "yes," then at step 1322, a failed data handling/recovery operation is executed to recover the data which was being programmed.

At decision step 1324, it is determined if a DEPWR fail stop has been reached. If the answer at decision step 1324 is "yes," then at step 1326, the plane that failed DEPWR is disabled. If the answer at decision step 1324 is "no," or following step 1326, at step 1328, the operation proceeds to the next word line (WLn+1) but without any planes that have been disabled.

In some embodiments where the programming operation is an SLC operation, the DEPWR techniques may be particularly useful as performance is typically a very important attribute of SLC memory devices, and the DEPWR techniques of the present disclosure offer improved reliability with minimal performance impact.

In some alternate embodiments, rather than the DEPWR operation being a dynamic rolling post-write read operation where specific word lines are targeted, the targeting is on a block level. That is, the determination of whether to trigger DEPWR that takes place in step 1314 is employed at the block level to determine if the entire block is a bad block with the variable M being a total string amount for one block rather than a total string amount for one word line. If the answer at decision step 1316 is "yes," then the DEPWR operation of step 1318 will be performed on the entire memory block.

In some embodiments, the DEPWR operation can be used in combination with a so-called "selective EPWR" operation whereby EPWR is automatically performed on certain word lines that are known, such as through experimentation during development of the memory device, to be at an elevated risk for read error. Additionally, in some embodiments, a word line offset can be incorporated into the DEPWR loop criteria for different word lines. Thus, as the number of word lines in a memory device increases with advancements in memory devices, different word lines may require additional programming loops to complete programming. The offset for certain word lines may prevent the unnecessary triggering of DEPWR in some instances.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
   a plurality of memory cells arranged in a plurality of word lines;
   a controller in electrical communication with the plurality of memory cells, the controller being configured to:
   program the memory cells of a selected word line of the plurality of word lines in a plurality of programming loops and count the number of programming loops to complete programming,
   compare the number of programming loops to complete programming of the memory cells of the selected word line to at least one of a predetermined upper limit and a predetermined lower limit to determine if a plane containing the selected word line is at an elevated risk for read failure, and
   in response to a determination that the plane containing the selected word line is at an elevated risk for read failure, conduct a post write read operation on at least one word line of the plurality of word lines.

2. The memory device as set forth in claim 1 wherein the plane containing the selected word line is a first plane and further including at least one additional plane adjacent the first plane and wherein the controller is configured to conduct the post write read operation on word lines of both of the first plane and the at least one additional plane in response to the number of programming loops to complete programming of the selected word line being greater than the predetermined upper limit or being less than the predetermined lower limit.

3. The memory device as set forth in claim 1 wherein each word line of the plurality of word lines includes a plurality of strings and wherein the controller is configured to program the memory cells of the selected word line on a string by string basis.

4. The memory device as set forth in claim 3 wherein the controller programs the memory cells of all of the strings of the selected word line prior to conducting the post write read operation.

5. The memory device as set forth in claim 1 wherein the controller is configured to perform a data recovery operation in response to at least one word line failing the post write read operation.

6. The memory device as set forth in claim 1 wherein the controller is configured to disable a plane containing the at least one word line in response to the at least one word line failing the post write read operation.

7. The memory device as set forth in claim 1 wherein the controller is configured to program three bits of data into each of the memory cells of the selected word line.

8. A method of programming a plurality of memory cells in a memory device, comprising the steps of:
preparing a memory device that includes a plurality of memory cells arranged in a plurality of word lines;
programming the memory cells of a selected word line of the plurality of word lines in a plurality of programming loops while counting the number of programming loops to complete programming;
comparing a total number of programming loops to complete programming of the memory cells to at least one of a predetermined upper limit and a predetermined lower limit to determine if a plane containing the selected word line is at an elevated risk of read failure; and
in response to a determination that the plane is at an elevated risk of read failure, conducting a post write read operation on at least one word line of the plurality of word lines.

9. The method as set forth in claim 8 wherein the plane containing the selected word line is a first plane and further including at least one additional plane, and further including the step of conducting the post write read operation on word lines of both of the first plane and the at least one additional plane in response to the number of the determination that the number of programming loops to complete programming of the selected word line is greater than the predetermined upper limit or is less than the predetermined lower limit.

10. The method as set forth in claim 8 wherein each word line of the plurality of word lines includes a plurality of strings and wherein the memory cells of the selected word line are programmed on a string by string basis.

11. The method as set forth in claim 10 wherein the memory cells of all of the strings of the selected word line are programmed prior to conducting the post write read operation.

12. The method as set forth in claim 8 further including the step of performing a data recovery operation in response to at least one word line failing the post write read operation.

13. The method as set forth in claim 8 further including the step of disabling the plane containing the at least one word line in response to the at least one word line failing the post write read operation.

14. The method as set forth in claim 8 wherein three bits of data are programmed into each memory cell of the selected word line during the step of programming the memory cells.

15. An apparatus, comprising:
a plurality of memory cells arranged in a plurality of word lines;
a programming means in electrical communication with the plurality of memory cells for programming the memory cells, the programming means being configured to:
program the memory cells of a selected word line in a plurality of program-verify iterations while counting a number of program-verify iterations to complete programming,
compare the number of programming loops to complete programming to a predetermined criteria to determine if a plane containing the selected word line is at an elevated risk for read failure, and
in response to a determination that the plane containing the selected word line is at an elevated risk for read failure, conduct a post write read operation on at least one word line of the plurality of word lines.

16. The apparatus as set forth in claim 15 wherein the plane containing the selected word line is a first plane and further including at least one additional plane adjacent the first plane and wherein the programming means is configured to conduct the post write read operation on word lines of both of the first plane and the at least one additional plane in response to the number of programming loops to complete programming of the selected word line being greater than a predetermined upper limit or being less than a predetermined lower limit.

17. The apparatus as set forth in claim 15 wherein each word line of the plurality of word lines includes a plurality of strings and wherein the programming means is configured to program the memory cells of the selected word line on a string by string basis.

18. The apparatus as set forth in claim 17 wherein the programming means programs the memory cells of all of the strings of the selected word line prior to conducting the post write read operation.

19. The apparatus as set forth in claim 15 wherein the programming means is configured to perform a data recovery operation in response to at least one word line failing the post write read operation.

20. The apparatus as set forth in claim 15 wherein the programming means is configured to disable a plane containing the at least one word line in response to the at least one word line failing the post write read operation.

* * * * *